United States Patent
Besana et al.

(10) Patent No.: US 7,338,857 B2
(45) Date of Patent: Mar. 4, 2008

(54) INCREASING ADHERENCE OF DIELECTRICS TO PHASE CHANGE MATERIALS

(75) Inventors: Paola Besana, Bareggio (IT); Tina Marangon, Merate (IT); Amos Galbiati, Grezzago (IT)

(73) Assignee: Ovonyx, Inc., Rochester Hills, MI (US)

( * ) Notice: Subject to any disclaimer, the term of this patent is extended or adjusted under 35 U.S.C. 154(b) by 0 days.

(21) Appl. No.: 10/965,129

(22) Filed: Oct. 14, 2004

(65) Prior Publication Data

US 2006/0084227 A1    Apr. 20, 2006

(51) Int. Cl.
*H01L 21/336* (2006.01)

(52) U.S. Cl. .............. 438/257; 257/E31.029; 438/407; 438/440

(58) Field of Classification Search .............. 257/3, 257/E45.002, E45.042, E31.029; 438/407, 438/440
See application file for complete search history.

(56) References Cited

U.S. PATENT DOCUMENTS

| | | | |
|---|---|---|---|
| 3,271,591 A | 9/1966 | Ovshinsky | 307/88.5 |
| 3,573,757 A | 4/1971 | Adams | 340/173 |
| 4,634,494 A * | 1/1987 | Taji et al. | 438/705 |
| 4,835,597 A * | 5/1989 | Okuyama et al. | 257/634 |
| 5,825,046 A * | 10/1998 | Czubatyj et al. | 257/2 |
| 5,912,839 A | 6/1999 | Ovshinsky | 365/185.03 |
| 6,339,544 B1 * | 1/2002 | Chiang et al. | 365/163 |
| 6,566,700 B2 * | 5/2003 | Xu | 257/296 |
| 6,816,404 B2 | 11/2004 | Khouri et al. | 365/163 |
| 6,869,841 B2 * | 3/2005 | Xu | 438/239 |
| 6,911,768 B2 * | 6/2005 | Chen et al. | 313/391 |
| 6,972,430 B2 * | 12/2005 | Casagrande et al. | 257/4 |
| 7,170,223 B2 * | 1/2007 | Smith et al. | 313/495 |
| 2003/0189200 A1 * | 10/2003 | Lee et al. | 257/1 |
| 2003/0201183 A1 * | 10/2003 | Moore | 205/78 |
| 2003/0211732 A1 * | 11/2003 | Chiang | 438/652 |
| 2003/0214856 A1 | 11/2003 | Pellizzer et al. | 365/200 |
| 2004/0012338 A1 * | 1/2004 | Smith et al. | 315/169.3 |
| 2004/0113136 A1 * | 6/2004 | Dennison | 257/2 |
| 2006/0046479 A1 * | 3/2006 | Rajagopalan et al. | 438/683 |

FOREIGN PATENT DOCUMENTS

| | | |
|---|---|---|
| EP | 1 326 254 A1 | 7/2003 |
| EP | 1 339 111 A1 | 8/2003 |
| GB | 1 296 712 | 11/1972 |

* cited by examiner

*Primary Examiner*—Thao P. Le
(74) *Attorney, Agent, or Firm*—Trop, Pruner & Hu, P.C.

(57) ABSTRACT

A phase change material is formed over a dielectric material. An impurity is introduced into the dielectric to improve the adherence of said dielectric to said phase change material.

6 Claims, 5 Drawing Sheets

INCREASING ADHERENCE OF DIELECTRICS TO PHASE CHANGE MATERIALS

BACKGROUND

The present invention relates to a phase change memory.

Phase change memories use a class of materials that have the property of switching between two phases having distinct electrical characteristics, associated with two different crystallographic structures of the material and variations thereof, such as an amorphous, disordered phase and a crystalline or polycrystalline, ordered phase. The two phases are hence associated to resistivities of considerably different values where the more disordered phases are higher in resistivity and the crystalline phases are lower in resistivity.

Currently, the alloys of elements of group VI of the periodic table, such as Te or Se, referred to as chalcogenides or chalcogenic materials, can be used advantageously in phase change memory cells. The currently most promising chalcogenide is formed from an alloy of Ge, Sb and Te ($Ge_2Sb_2Te_5$), which is now widely used for storing information on overwritable disks and has also been proposed for mass storage.

In the chalcogenides, the resistivity may vary by two or more orders of magnitude when the material passes from the amorphous (more resistive) phase to the crystalline (more conductive) phase, and vice versa.

Phase change can be obtained by locally increasing the temperature. Below 150° C., both the phases are relatively stable, although there is some tendency over a period years at 150 C for the reset amorphous state to crystallize, thereby lowering its resistance. Starting from an amorphous state, and rising the temperature above 200° C., there is a rapid nucleation of the crystallites and, if the material is kept at the crystallization temperature for a sufficiently long time, it undergoes a phase change and becomes crystalline. To bring the chalcogenide back to the amorphous state, it is necessary to raise the temperature above the melting temperature (approximately 600° C.) and then rapidly cool off the chalcogenide.

DETAILED DESCRIPTION

Figure 1:
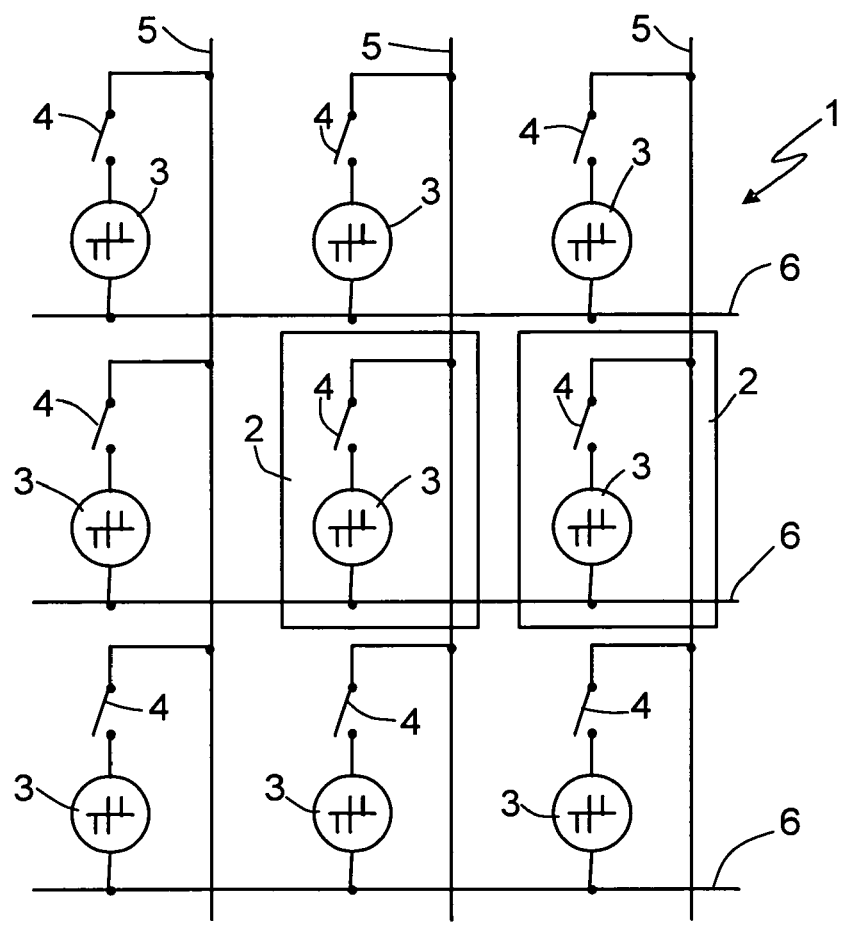
FIG. 1 is a schematic diagram of one embodiment of the present invention.

In a phase change memory using chalcogenic elements as storage elements, memory cells are arranged in rows and columns to form an array, as shown in FIG. 1. The memory array 1 of FIG. 1 comprises a plurality of memory cells 2, each including a memory element 3 of the phase change type and a selection element 4. The memory cells 2 are interposed at cross-points of rows 6 (also called word lines) and columns 5 (also called bit lines).

In each memory cell 2, the memory element 3 has a first terminal connected to an own word line 5 and a second terminal connected to a first terminal of its own selection element 4. The selection element 4 has a second terminal connected a bit line 6. In another solution, the memory element 3 and the selection element 4 of each cell 2 may be exchanged in position.

A binary memory may be formed by an array of cells including a switch element called "ovonic threshold switch" (also referred to as an OTS hereinafter), connected in series with a memory element called "ovonic memory switch" (OMS). The OTS and the OMS may be formed adjacent to each other on an insulating substrate, connected through a conducting strip. Cells are coupled between a row and a column of a memory array and the OTS may function as a selection or access device 4.

The OMS is formed by a chalcogenic semiconductor material having two distinct metastable phases (crystalline and amorphous) associated with different resistivities, while the OTS may be built with a chalcogenic semiconductor material having a single phase (generally amorphous, but sometimes crystalline) with two distinct regions of operation associated with different resistivities. If the OTS has a higher resistance than the OMS, when a memory cell is to be read, a voltage drop is applied to the cell that is insufficient to trigger the OMS when the latter is in its higher resistance condition (associated with a digital "0" state), but is sufficient to drive the OTS and OMS into their low resistance condition when the OMS is already in its low resistance condition (associated with a digital "1" state).

Figure 2:
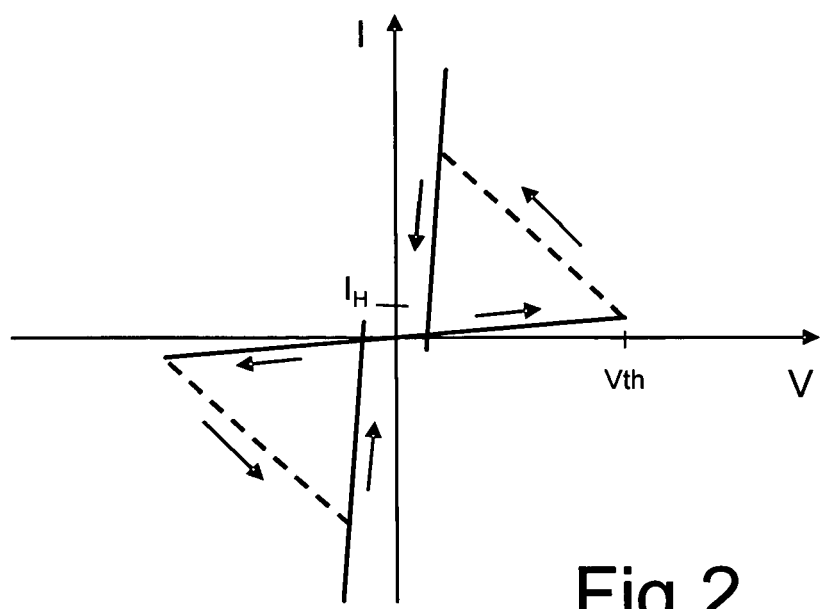
FIG. 2 is a current-voltage curve for one embodiment of the present invention.

An OTS may have the characteristic shown in FIG. 2. An OTS has a high resistance for voltages below a threshold value Vth. When the applied voltage exceeds the threshold value Vth, the switch begins to conduct at a substantial, constant, low voltage and presents a low impedance. When the current through the OTS falls below a holding current $I_H$, the OTS goes back to its high-impedance condition. This behavior may be symmetrical and may occur also for negative voltages and currents.

A phase change memory device comprises a chalcogenic material and a resistive electrode, also called a heater. In fact, from an electrical point of view, the crystallization temperature and the melting temperature are obtained by causing an electric current to flow through the chalcogenide material and its resistive electrode in contact or close proximity with the chalcogenic material. In this way, the chalcogenic material is heated by Joule effect in the electrode and by current/voltage and Joule effect in the chalcogenide.

In particular, a voltage/current pulse of a suitable length (corresponding to the crystallization time) and amplitude (corresponding to the crystallization temperature) may be applied to crystallize the chalcogenic material. The chalcogenic material changes state, switching to a lower resistivity, more crystalline state (also called the set or "1" state). Vice versa, a shorter voltage/current pulse, such as 20 nanoseconds of suitable amplitude (corresponding to the melting temperature) melts the chalcogenic material, cooling it down rapidly and then quenching it in the amorphous phase.

Memory regions, for example in the form of strips of a chalcogenic material, may directly contact heating regions. In order to reduce the area of the memory cells, a mold layer of a further dielectric material, such as silicon nitride, is first formed on the dielectric layer housing the resistive material. Then a metallic, semi-metallic or semiconductor glue layer (e.g. of Ti or TiSiN) is deposited, which adheres to the mold layer. After narrow slits have been opened in the mold layer and in the glue layer to expose the heating regions, a chalcogenic layer is deposited on the mold layer, thus filling the slits and contacting the heating regions. The glue layer reduces detachment of the chalcogenic layer. In fact, the chalcogenic layer does not adhere tightly to dielectric materials, and would easily delaminate in subsequent process steps, especially those involving a thermal stress (annealing, oxidation, barrier and metallic layer deposition).

However, the use of the metallic/semi-metallic/semiconductor glue layers is not free from limitations. First of all, glue layers may involve a surface cleaning treatment by sputter etch before deposition of the chalcogenic layer. During this step, especially when metallic or semi-metallic glue layers are used, reflected power may impair efficiency and yield. In fact, sputter etch processes and machines are normally optimized for treatment of dielectric layers, so that they are not suitable for different materials.

Moreover, the stack formed by the mold layer, the glue layer and the chalcogenic layer may need a further etch to define connection lines (bit lines) for the memory cells. Problems involved in etching stacks comprising both metallic/semi-metallic/semiconductor layers and dielectric layers are well-known. In particular, several etching agents must be used, because the materials forming the stack are only selectively removed. Hence, the connection lines or whatever structures are to be formed often have irregular profiles and unpredictable dimensions, and are insufficiently reproducible. Etching thick metal layers is difficult as well. In addition, the thickness of the glue layer may be substantiated relative to the thickness of connection lines or structures.

Figure 3:
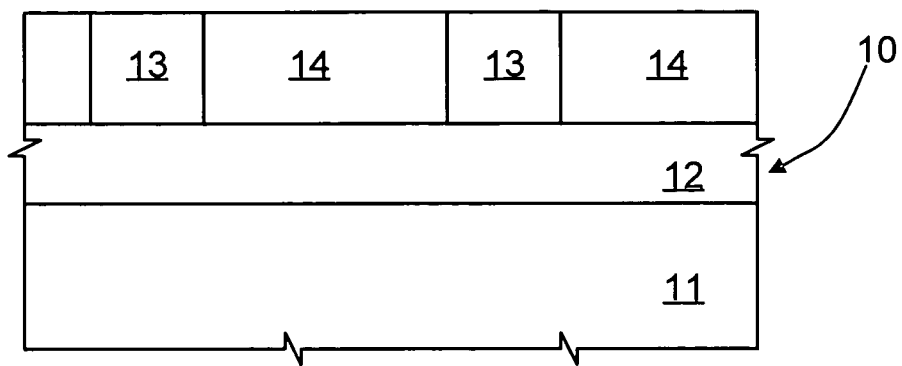
FIGS. 3-10 are cross-sections through a semiconductor device according to a first embodiment of the invention, in subsequent manufacturing steps, taken along line 10-10 of FIG. 12.

With reference to FIG. 3, a semiconductor wafer 10, including a substrate 11, is initially subject to the usual steps to form circuitry components and any element to be integrated into the substrate 11. For example, decoding components may be integrated in the substrate 11.

Then, the wafer 10 is covered by an insulating layer 12. Row lines 13 (e.g., of copper) are formed on top of the insulating layer 12, insulated from each other by a first dielectric layer 14. The row lines 13 (word lines) may be formed by first depositing the first dielectric layer 14, removing the dielectric material where the row lines 13 are to be formed, and then filling the resulting trenches with copper (Cu). Any excess copper is removed from the surface of the wafer 10 by chemical mechanical polishing (CMP), all pursuant to a damascene process.

Figure 4:
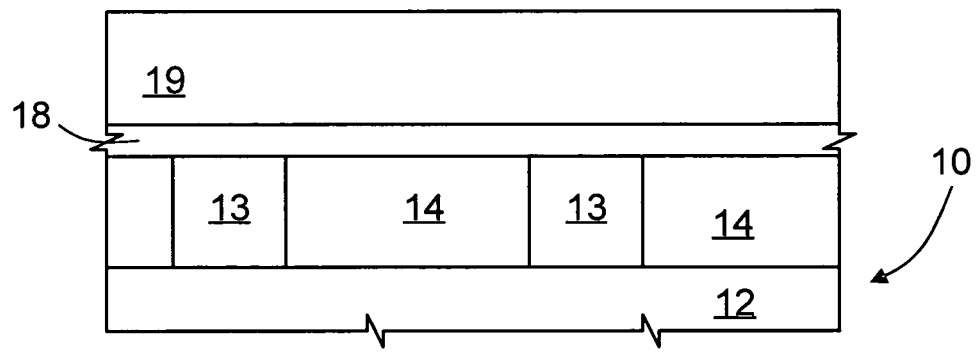
Figure 5:
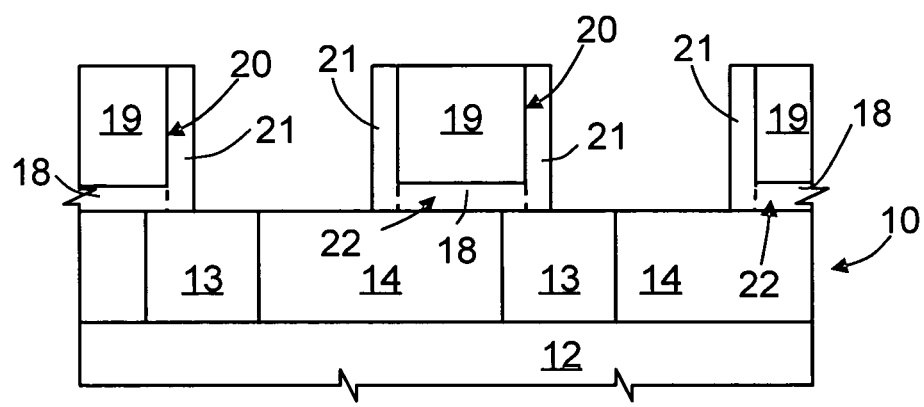

Thereafter, an encapsulating structure is formed as indicated in FIG. 4. The encapsulating structure may be formed by depositing, in sequence, a first nitride layer 18 and a first oxide layer 19 and then selectively removing the first nitride layer 18 and the first oxide layer 19 down to the surface of the first dielectric layer 14 as shown in FIG. 5. Thus, for each row line 13, an opening 20 is formed which extends at least in part on top of the row line 13. An opening 20 may extend along the whole respective row line 13 or along only a part thereof, in which case a plurality of openings 20 extend in alignment with each other along each row line 13.

Then, a spacer layer (e.g., of silicon nitride) is deposited and etched back. Thus, the horizontal portions of the spacer layer are removed, and only vertical portions 21 thereof, extending along the vertical walls of the opening 20, are left. These vertical portions 21 join the first nitride layer 18 laterally to the openings 20 and form, with the first nitride layer 18, a protective region 22. Thus, the structure of FIG. 5 is obtained, wherein the protective region 22 together with the first oxide layer 19 form an encapsulating structure.

Figure 6:
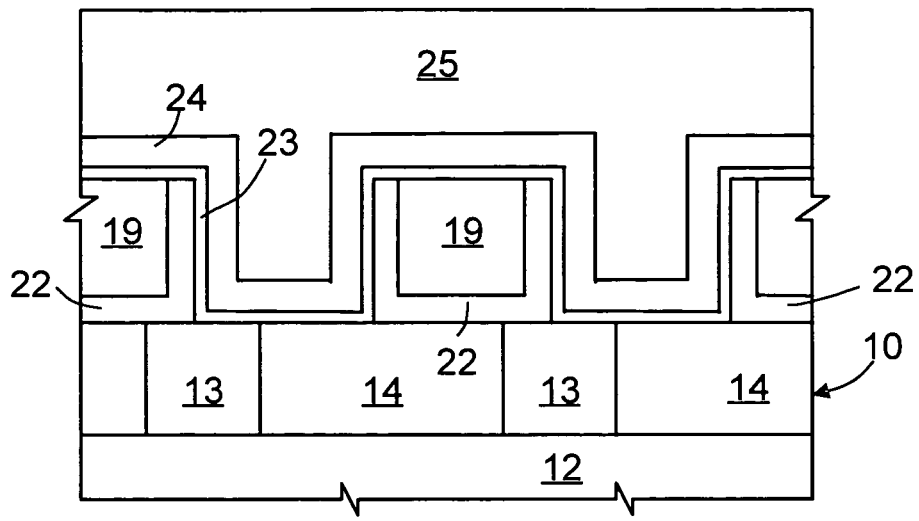

Thereafter, as shown in FIG. 6, a heater layer 23 is deposited and stabilized. For example, TiSiN may be used, which conformally covers the underlying structure. One vertical wall of the heater layer 23 extends onto and makes contact with a respective row line 13. Subsequently, a sheath layer 24 (e.g., of silicon nitride) and a second dielectric layer 25 are deposited. The second dielectric layer 25 may be deposited by Sub Atmospheric Chemical Vapor Deposition Undoped Silicon Glass (USG), High Density Plasma USG, or Plasma Enhanced Chemical Vapor Deposition USG to completely fill the openings 20 to complete the encapsulating structure in some embodiments.

In practice, the sheath layer 24 and the protective region 22 may isolate the heater layer 23 from the first and second oxide layers 19, 25 to reduce oxidation of the heater material.

Figure 7:
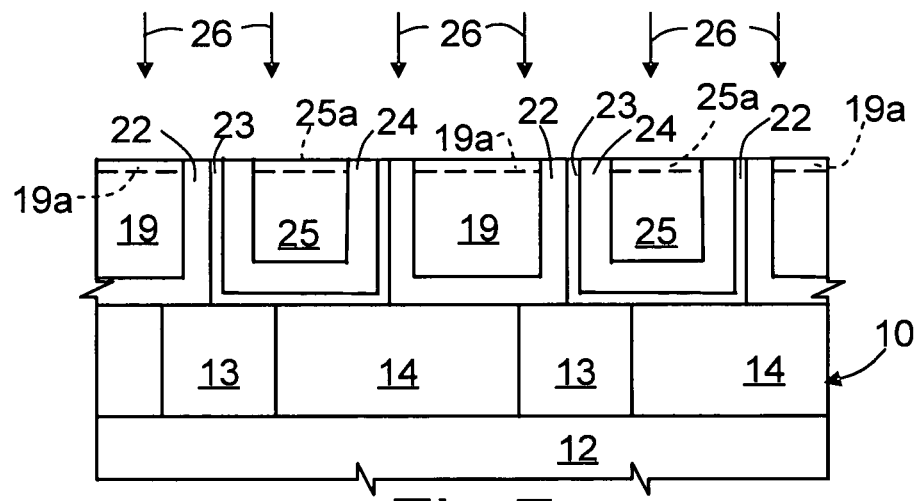

The structure is then planarized by chemical mechanical polishing to remove all portions of the second dielectric layer 25, the sheath layer 24, and the heater layer 23 extending above the openings 20 as shown in FIG. 7. Then, a gluing substance 26, which in one embodiment may include silicon, is implanted in the wafer 10 to form first and second surface glue regions 19a, 25a in respective superficial portions of the first and, respectively, the second oxide layers 19, 25. The concentration of the implanted gluing substance 26 in the first and second surface glue regions 19a, 25a, where it penetrates, may be between $10^{16}$ and $10^{23}$ atoms/cm$^3$ in some embodiments.

The addition of the gluing substance 26 with a controlled superficial concentration improves the capability of dielectric materials, such as silicon dioxide, to adhere to chalcogenides. In practice, the implanted gluing substance 26 makes the surfaces of the first and the second oxide layer 19, 25 suitable for adhesion to a chalcogenic layer which is to be subsequently deposited thereon. Other gluing substances than Si may be implanted as well, such as As, Sb, Ge, B, In, Ti, P, Mo and W. After implantation, the surface 11a of the wafer 11, which is mostly of dielectric material, may undergo a pre-deposition cleaning treatment by sputter etch.

Figure 8:
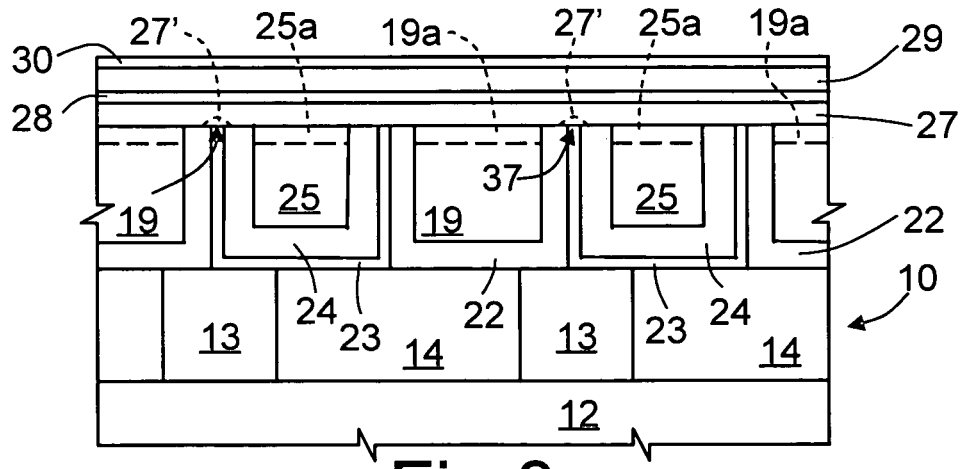

Next, an OMS/OTS (Ovonic Memory Switch/Ovonic Threshold Switch) stack may be deposited as indicated in FIG. 8. In detail, a first chalcogenic layer 27 (e.g., Ge$_2$Sb$_2$Te$_5$), a first barrier layer 28 (e.g., TiAlN), a second chalcogenic layer 29 (e.g., As$_2$Se$_3$) and a second barrier layer 30 (e.g., TiAlN) are deposited. The previously implanted gluing substance 26 causes the first chalcogenic layer 27 to tightly adhere to the first and the second surface glue region 19a, 25a, and the adhesion surface may be sufficiently wide to withstand any thermal or mechanical stress in subsequent manufacturing steps.

The above materials are only indicative, and any chalcogenic material suitable to store information depending on its physical state (for first chalcogenic layer 27) and to operate as a selector for second chalcogenic layer 29) may be used. Storage elements 27' are formed at mutual contact areas 37 of the heating layer 23 and the first chalcogenic layer 27 (see also FIGS. 11 and 12).

Then, the first chalcogenic layer 27, the first barrier layer 28, the second chalcogenic layer 29 and the second barrier layer 30 are defined (FIG. 9) to form so called "dots" 31 at the intersections of the rows and columns of the matrix. The dots 31 may extend along the length of a column 1.

Figure 9:
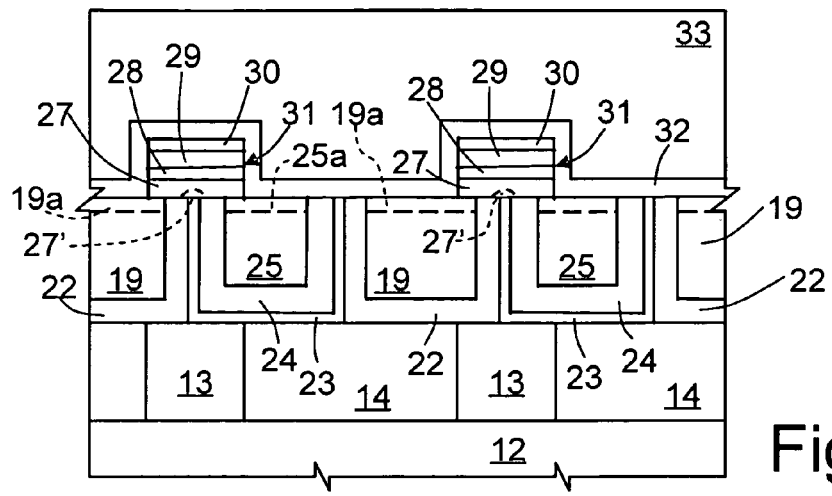

Then a sealing layer 32 (e.g., of silicon nitride) and an interlayer dielectric 33 (e.g., of silicon dioxide) are deposited as indicated in FIG. 9.

Finally, the wafer 10 is subjected to CMP to planarize the structure and column lines and vias are formed, for example, using a standard dual damascene copper process. The interlayer dielectric 33 and the first dielectric layer 14 (as well as the sealing layer 32 and the bottom of the protective region 22, where present) are etched in a two-step process to form vias openings 35 (extending down to the row lines 13) and column trenches 36 (extending down to the dots 31). The two etching steps may be carried out in any sequence. Then, a metal material (e.g. Cu) is deposited that fills the via openings 35 (FIG. 11) and the column trenches 36, forming vias 40 and column lines 41a. Furthermore, row line connections 41b are also formed. Thus the structure of FIGS. 10-12 is obtained.

Figure 10:
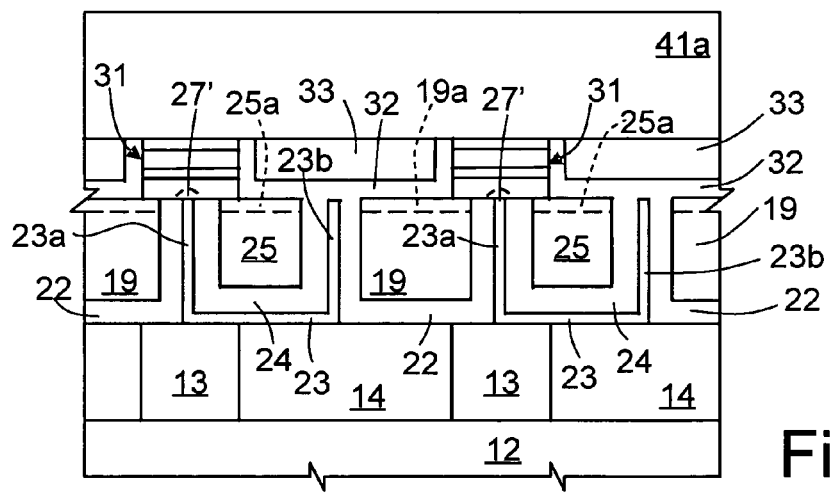
Figure 11:
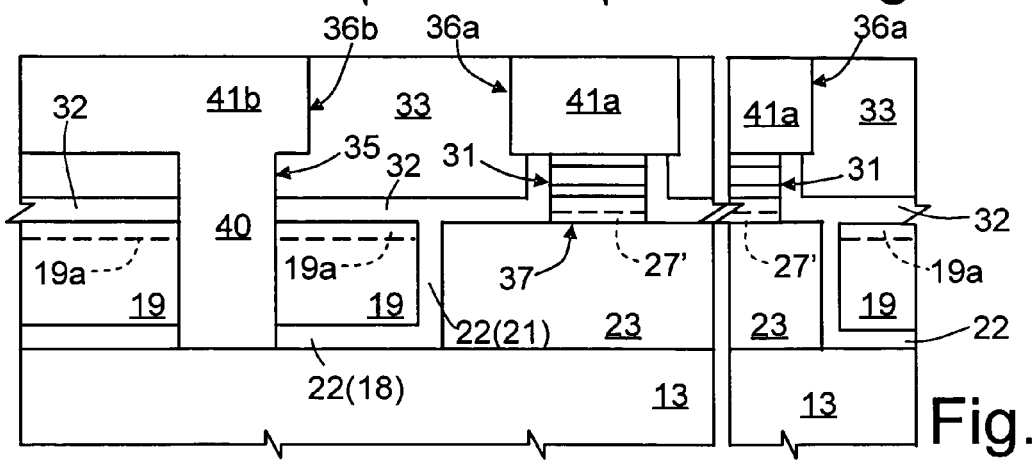
FIG. 11 shows a cross-section through the device of FIG. 12, taken along line 11-11 of FIG. 12.
Figure 12:
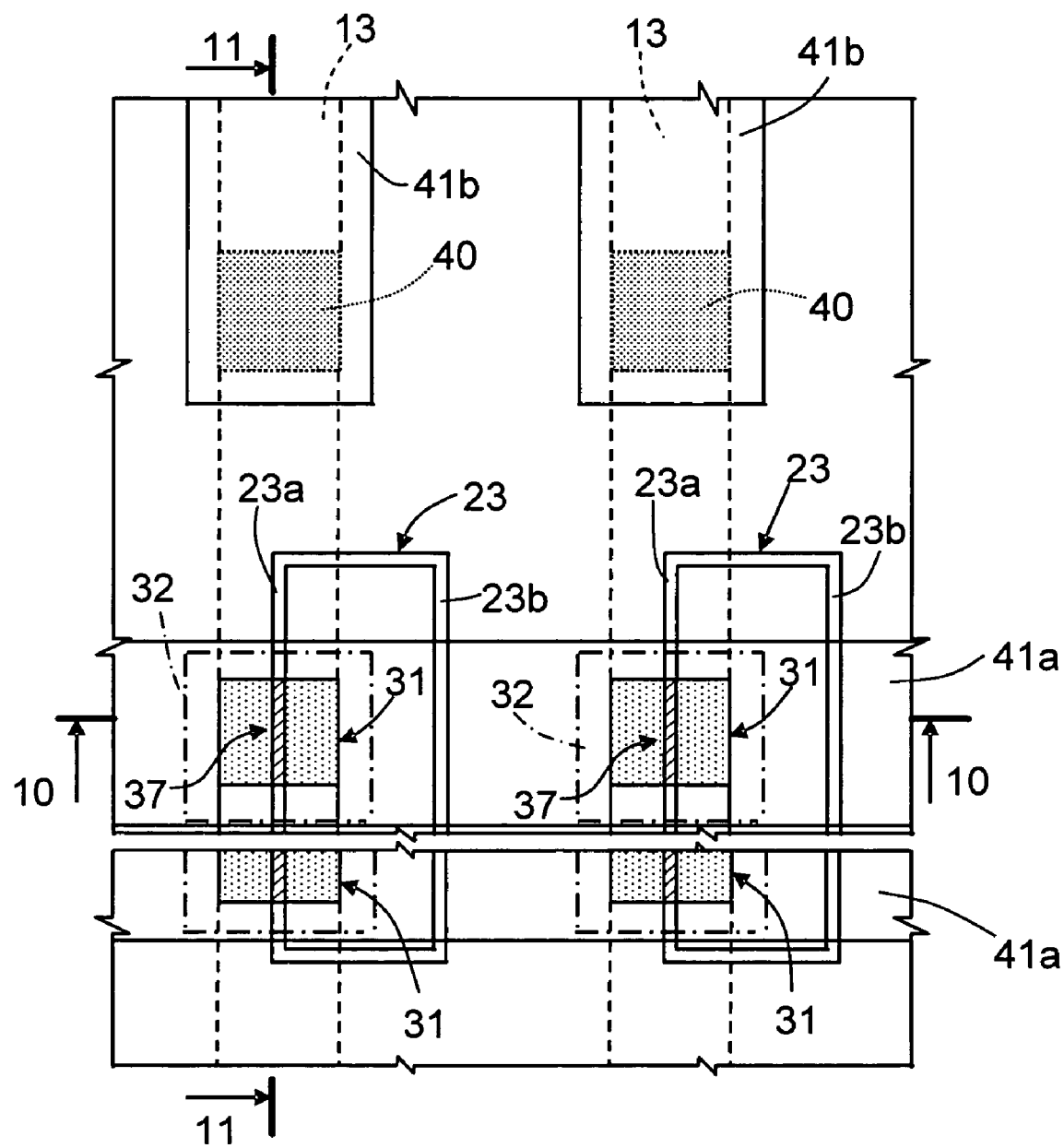
FIG. 12 is a plan view of the device of FIGS. 10 and 11.

As clearly visible from FIGS. 10-12, the heater layer 23 form heaters or resistive elements having substantially box-like shapes with a first vertical elongated wall 23a (on the left, in the drawings) extending approximately above the midline of the respective row line 13 and a second vertical elongated wall 23b (on the right) extending on top of the first oxide layer 19. Each first vertical elongated wall 23a forms a wall-shaped heater that contacts the respective dots 31 along a line (contact area 37 indicated by a hatching in FIG. 12) and is shared by all the dots 31 aligned on a single row line 13, while the second vertical elongated wall 23b has no function. The electrical connection of all the dots 31 along a same row line through the wall-shaped heater 23 does not impair the operation of the memory device, since the second chalcogenic material 29 of the dots 31 form an OTS or selection element allowing addressing only the dots 31 connected to both the row line 13 and the column line 41a that are addressed.

In particular, the problems caused by the poor adhesion between chalcogenic and dielectric materials may be reduced, in some embodiments, by adding the gluing substance to the dielectric layers, namely at superficial regions thereof, before depositing the chalcogenic layer. Moreover, problems involved in etching stacks comprising both metallic or semi-metallic layers may be reduced in some embodiments. Thus, stacked structures having regular profiles and predictable dimensions may be made in some cases.

The phase change memory cells manufactured according to the present invention may also be compact. Their thickness may be reduced, because the gluing may be accomplished inside the dielectric layers arranged under the chalcogenic layer, instead of using deposited glue layers.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   ion implanting a dielectric to improve the adherence of a chalcogenide to said dielectric; and
   forming a chalcogenide over said dielectric.

2. A method according to claim 1, wherein introducing includes implanting an impurity selected from the group consisting of: Si, As, Sb, Ge, B, In, Ti, P. Mo, and W.

3. A method according to claim 2, including introducing silicon.

4. A method according to claim 3, including introducing silicon into said dielectric at a concentration between $10^{16}$ and $10^{23}$ atoms/cm$^3$.

5. The method of claim 1 including depositing a phase change material directly on said dielectric.

6. The method of claim 1 including forming a planar chalcogenide over said dielectric.

* * * * *